United States Patent
Liu et al.

(10) Patent No.: US 11,588,409 B2
(45) Date of Patent: Feb. 21, 2023

(54) FLYBACK CONVERTER WITH EDGE-BASED ISOLATED COMMUNICATION

(71) Applicant: DIALOG SEMICONDUCTOR INC., Campbell, CA (US)

(72) Inventors: Wenduo Liu, Campbell, CA (US); Kun Yang, Campbell, CA (US); Laiqing Ping, Campbell, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 130 days.

(21) Appl. No.: 17/064,533

(22) Filed: Oct. 6, 2020

(65) Prior Publication Data

US 2021/0021201 A1 Jan. 21, 2021

Related U.S. Application Data

(63) Continuation of application No. 16/276,475, filed on Feb. 14, 2019, now Pat. No. 10,797,608.

(51) Int. Cl.
*H02M 3/335* (2006.01)
*H03K 19/20* (2006.01)

(52) U.S. Cl.
CPC ........ *H02M 3/33592* (2013.01); *H03K 19/20* (2013.01)

(58) Field of Classification Search
CPC .......... H02M 3/33592; H02M 3/33523; H03K 19/20
See application file for complete search history.

(56) References Cited

U.S. PATENT DOCUMENTS

| | | | | |
|---|---|---|---|---|
| 4,656,661 A | * | 4/1987 | Carbrey | H04B 3/36 327/91 |
| 6,982,582 B1 | * | 1/2006 | Cheng | H03K 3/02337 327/205 |
| 2003/0071673 A1 | | 4/2003 | Jordanger et al. | |
| 2008/0192509 A1 | * | 8/2008 | Dhuyvetter | H02M 3/33523 363/16 |
| 2009/0091951 A1 | | 4/2009 | Yang et al. | |
| 2014/0169038 A1 | * | 6/2014 | Kamath | H03D 3/00 363/16 |
| 2015/0109832 A1 | * | 4/2015 | Heo | H02M 3/33507 363/21.18 |
| 2016/0359421 A1 | * | 12/2016 | Lin | H02M 1/08 |

FOREIGN PATENT DOCUMENTS

| | | | |
|---|---|---|---|
| CN | 101026338 A | | 8/2007 |
| CN | 101572485 A | | 11/2009 |
| CN | 104079190 A | | 1/2014 |
| CN | 106411136 A | * | 2/2017 |
| CN | 208369476 U | | 1/2019 |

* cited by examiner

*Primary Examiner* — Harry R Behm
(74) *Attorney, Agent, or Firm* — Haynes & Boone, LLP

(57) ABSTRACT

A flyback converter communication channel is provided that comprises a pair of capacitors. A transmitter on a first side of a transformer for the flyback converter transmits a transmitter signal over a first one of the capacitors. The transmitter also transmits a complement of the transmitter signal over a second one of the capacitors. A receiver on a second side of the transformer controls a switch transistor responsive to a high-pass-filtered difference of the received signals from the pair of capacitors.

5 Claims, 7 Drawing Sheets

FLYBACK CONVERTER WITH EDGE-BASED ISOLATED COMMUNICATION

CROSS REFERENCE TO RELATED APPLICATIONS

The present application is a continuation application of U.S. Non-Provisional patent application Ser. No. 16/276,475, filed Feb. 14, 2019, which is hereby incorporated by reference in its entirety.

TECHNICAL FIELD

This application relates to flyback converters, and more particularly to a flyback converter with edge-based communication through a ground-isolating channel.

BACKGROUND

A flyback switching power converter is typically provided with a mobile device for battery charging as its transformer provides safe isolation from AC household current. This isolation introduces a problem in that the power switching may be controlled by a primary-side controller that in turn needs to coordinate a cycling of a synchronous rectifier transistor on the secondary side. The primary-side controller cannot directly control the synchronous rectifier transistor through a wire or lead because the ground isolation is then broken. An analogous problem occurs for a secondary-side controller that must control the power switch transistor.

To accommodate the flow of control signals either from the primary side to the secondary side or from the secondary side to the primary side, it is conventional to use optoisolators. But the use of optoisolators is complicated by their wide variation in current transfer ratio and other operating parameters. An alternative is the use of digital isolators to transfer the control signals with high voltage isolation and accurate timing. A digital isolator uses a high-frequency carrier signal to modulate a gate driver signal at the transmitting side. For example, the carrier signal may be one GHz or higher in frequency, having a pulse width distortion of less than 10 ns and a common-mode transient immunity of 50V/ns.

To demodulate the transmitted signal on the receiving side, a digital isolator typically requires a low-pass filter and a relatively-fast comparator. Such digital isolators are expensive and over-qualified for typical flyback converter application in which common-mode transient immunity is normally less then 1v/ns and the pulse-width distortion is larger than 50 ns.

Accordingly, there is a need in the art for flyback converters with improved communication of control signals between the primary and second sides of the transformer.

SUMMARY

A flyback converter includes a ground-isolating communication channel over which a pulsed signal may be exchanged between the primary and secondary sides of the flyback converter's transformer. The transmitter of the pulsed signal may be located on either the primary or secondary side of the transformer. The receiver would be opposite side of the transformer from the receiver. The ground-isolating communication channel includes a positive capacitor and a negative capacitor. The transmitter drives a pulsed transmitter signal into a transmitter terminal of the positive capacitor. In addition, the transmitter inverts the pulsed transmitter signal to form a complement transmitter signal that is driven into a transmitter terminal of the negative capacitor.

The receiver couples to a receiving terminal for the both capacitors to receive the transmitter signal and the complement transmitter signal. In addition, the receiver high-pass filters the received transmitter signal to form a positive filtered signal. Similarly, the receiver high-pass filters the received complement transmitter signal to form a negative filtered signal. A difference between the positive filtered signal and the negative filtered signal forms an edge-triggering signal that is pulsed temporarily to a positive voltage in response to a rising edge for the transmitter signal and that is pulsed temporality to a negative voltage in response to a falling edge for the transmitter signal.

To generate a received signal that is pulsed in common with the transmitter signal, the receiver includes a comparator that compares the positive filtered signal to the negative filtered signal so as to respond to the edge-triggering signal. To combat noise, the comparator may include hysteresis such that the comparator does not assert the receive signal to a power supply voltage until the edge-triggering signal voltage exceeds a positive threshold value. Similarly, the comparator grounds the receiver signal when the edge-triggering signal voltage is below a negative threshold value.

These advantageous features may be better appreciated through a consideration of the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

To address the need in the art for low-cost and accurate control signal communication, a flyback converter is provided with an isolated communication channel that propagates an edge-triggered gate control signal. On the transmitting side of the channel, a transmitter pulses a transmitter signal (TX) to control a transistor switch on the receiving side of the channel. Depending upon the pulsing, the transmitter signal is either ground or a power supply voltage. The transmitter also generates a complement transmitter signal that is the complement of the transmitter signal. The complement transmitter signal will thus equal the power supply voltage while the transmitter signal is grounded and will be grounded while the transmitter signal is charged to the power supply voltage. The channel includes a positive blocking capacitor over which the transmitter drives the positive signal. In addition, the channel includes a negative blocking capacitor over which the transmitter drives the negative signal.

The positive and negative blocking capacitors block any DC signal transmission from the transmitter to a receiver at a receiving-end of the channel. A receiving-end terminal for the positive blocking capacitor is coupled to a first resistor to form a first high-pass filter that filters the positive signal to form a filtered positive signal (Vp). Similarly, a receiving-end terminal for the negative blocking capacitor is coupled to a second resistor to form a second high-pass filter that filters the negative signal to form a filtered negative signal (Vn). Due to the high-pass filtering, a difference of the filtered voltages (Vp-Vn) will have a relatively-narrow positive voltage pulse in response to a rising edge for the positive signal and then return to zero volts. Conversely, the difference of the filtered voltages will have a relatively-narrow negative voltage pulse in response to the falling edge for the positive signal and then return to zero volts. The difference signal (Vp-Vn) may thus be denoted as an edge-triggering signal. A comparator with hysteresis may compare the filtered positive signal Vp to the filtered negative signal Vn to respond to the edge-triggering signal. A receiver output (RX) signal from the comparator may then be used to control the gate voltage of a switch transistor. Should the transmission be from the secondary side of the transformer to the primary side, the controlled switch transistor may be the power switch transistor. Conversely, if the transmission is from the primary side of the transformer to the secondary side, the controlled switch transistor may be a synchronous rectifier switch transistor.

Figure 1:
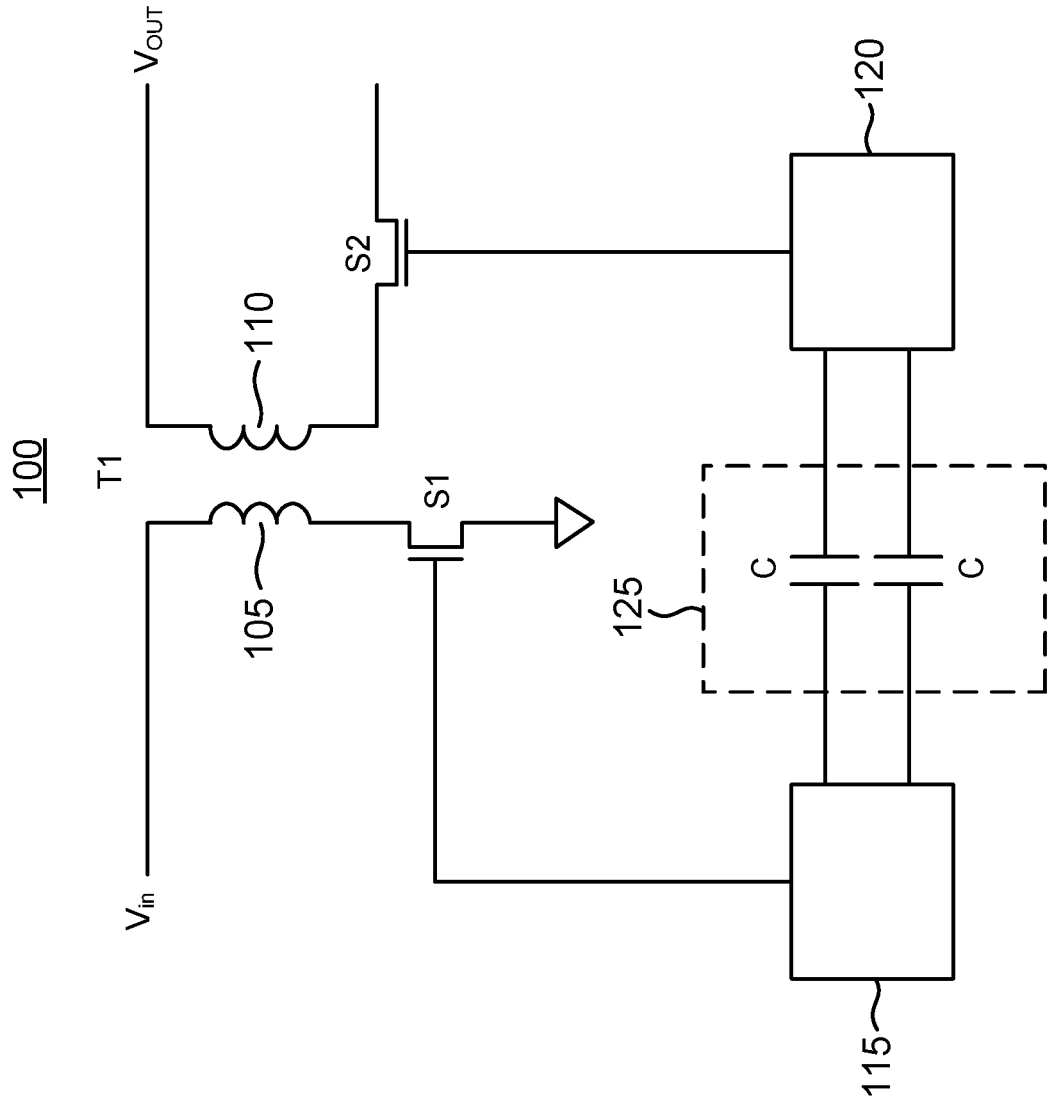
FIG. 1 illustrates a flyback converter including a ground-isolating channel for the transmission of an edge-triggering signal in accordance with an aspect of the disclosure.

The resulting control of the signal transmission is quite advantageous since it avoids both the expense of digital isolators and the stability and control issues for optoisolators. An example flyback converter 100 that includes an edge-triggered isolating communication channel is shown in FIG. 1. Flyback converter 100 includes a transformer T1 having a primary winding 105 and a secondary winding 110. A power switch transistor S1 controls whether a magnetizing current flows through primary winding 105. When power switch transistor S1 conducts, an input voltage Vin causes the magnetizing current to increase until power switch transistor S1 shuts off. While power switch transistor S1 conducts, a synchronous rectifier (SR) switch transistor S2 prevents a secondary current from flowing in secondary winding 110. After power switch transistor S1 shuts off, SR switch transistor S2 switches on to allow the secondary current to charge an output voltage Vout and deliver power to a load (not illustrated).

The control of power switch transistor S1 or of SR switch transistor S2 may be advantageously accomplished through an edge-triggering signaling conducted through a ground-isolating channel 125 formed by a positive capacitor Cp and a negative capacitor Cn. For example, suppose that a primary side controller (not illustrated) controls the cycling of power switch transistor S1. After power switch transistor S1 is turned off, the controller may trigger SR switch transistor S2 to turn on by transmitting an edge-triggering signal from a transmitter 115 through channel 125 to a receiver 120. Based upon the edge-triggering signal, receiver 120 controls a gate voltage of SR switch transistor S2 accordingly.

Conversely, suppose that a secondary-side controller (not illustrated) controls the cycling of power switch transistor S1 as well as the cycling of SR switch transistor S2. In that case, receiver 120 instead acts as a transmitter of the edge-triggering signal through channel 125 such that transmitter 115 acts as a receiver to control a gate voltage of power switch S1 responsive to the edge-triggering signal.

Figure 2:
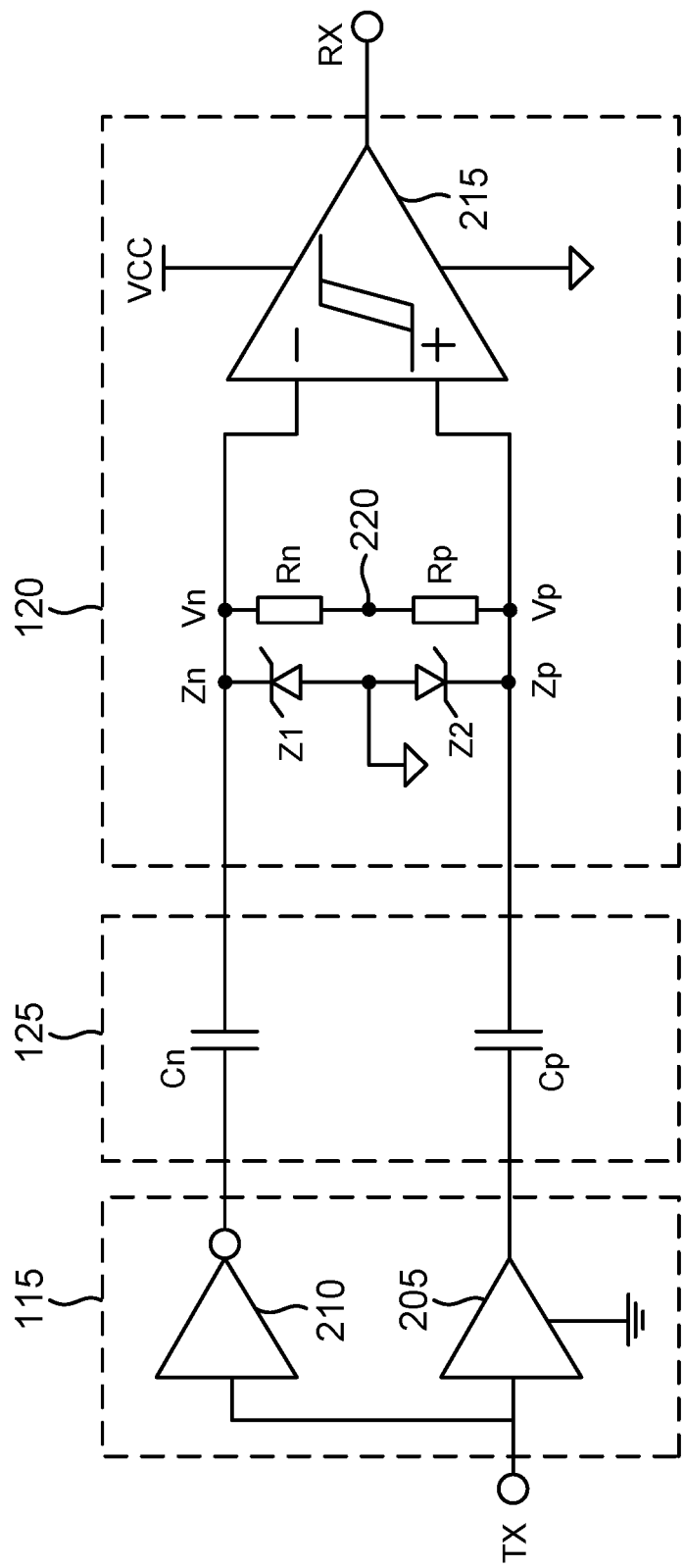
FIG. 2 illustrates an example transmitter for the transmission of the edge-triggering signal and an example receiver for receiving the edge-triggering signal in accordance with an aspect of the disclosure.

Transmitter 115 and receiver 120 may be implemented as shown in FIG. 2. Transmitter 115 includes a buffer 205 for driving the transmitter signal TX into a terminal of positive capacitor Cp. In addition, transmitter 115 includes an inverter 210 for inverting the transmitter signal to form the complement transmitter signal and for driving the complement transmitter signal into a terminal of negative capacitor Cn. A receiving-end terminal for positive capacitor Cp is coupled to a resistor Rp to form the first high-pass filter that filters the transmitter signal TX to form the filtered positive signal (Vp). Similarly, a receiving-end terminal for negative capacitor Cn is coupled to a resistor Rn to form the second high-pass filter that filters the complement transmitter signal to form the filtered negative signal (Vn). Resistors Rn and Rp are coupled in series across the receiving end terminals of capacitors Cp and Cn. A comparator 215 with hysteresis may compare the filtered positive signal Vp to the filtered negative signal Vn to respond to the edge-triggering signal (Vp-Vn) to produce the receiver signal RX. A zener diode Z1 clamps the filtered negative signal whereas a zener diode Z2 clamps the filtered positive signal.

Figure 3:
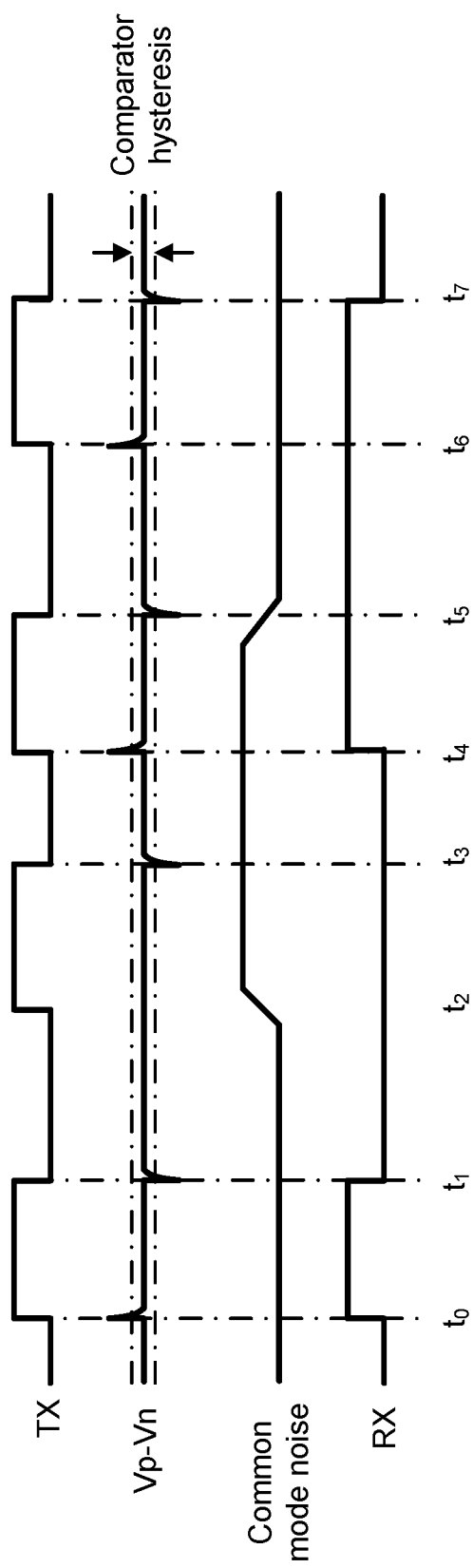
FIG. 3 illustrates some waveforms for the transmitter and receiver of FIG. 2.

Note that receiver 120 is symmetric with regard to a node 220 between resistors Rn and Rp. Such symmetry ensures that comparator 215 will be immune to static levels of common-mode noise that affects the filtered signals Vp and Vn. Some waveforms for the transmitter signal TX, the receiver signal RX, and the edge-triggering signal (Vp-Vn) are shown in FIG. 3. At a time t0, the transmitter signal TX pulses high to cause the edge-triggering signal to have a transient positive pulse. In response to the pulsing of the edge-triggering signal, the receiver signal RX is driven high to the power supply voltage at time t0. The pulse for the transmitter signal TX ends at a time t1, which cause the edge-triggering signal to have a transient negative pulse. In response to the pulsing of the edge-triggering signal, the pulse for the receiver signal RX ends at time t1. The pulsing of the transmitter signal TX is thus duplicated by the pulsing of the receiver signal RX. At a time t2, the transmitter signal TX again pulses high. But a common-mode noise for both the positive filtered signal Vp and the negative filtered signal Vn increases at time t2, which forces the edge-triggered signal to remain at ground at time t2. The receiver signal RX thus does not pulse high at time t2 despite the pulsing of the transmitter signal TX. The second pulse for the transmitter signal TX ends at time t3 during which the common-mode noise remains high. Although the common-mode noise is high, it is static at time t3 such that the edge-triggering signal responds to the falling edge for the transmitter signal TX and is thus pulsed low at time t3. The impedance symmetry in receiver 120 to node 220 ensures this immunity to static common-mode noise. To further enforce this common-mode noise immunity, a reference circuit (not illustrated) may maintain node 220 at a reference voltage such as one-half the power supply voltage.

A third pulse for the transmitter signal TX begins at a time t4. Since the common-mode noise is static although still high, the receiver signal RX is also pulsed high at time t4. The third pulse for the transmitter signal TX ends at a time t5 but the common-mode node changes to a low state at time t4 as well. The change in the common-mode noise causes the receiver signal RX to not respond to the falling edge for the transmitter signal at time t5. A fourth pulse for the transmitter signal TX begins at a time t6 but the receiver signal RX was already pulsed high at time t4. The fourth pulse for the transmitter signal ends at a time t7, which also ends the pulse for the receiver signal RX.

The common-mode noise changes cause the receiver signal RX to miss a rising edge at times t2 and t6 and miss a falling edge at times t3 and t5. Should the receiver signal RX control the SR switch transistor, the missing falling edges may result in converter failure. Moreover, a very large rate of change for the common-mode noise may result in a false spike for the edge-triggering signal and improperly pulse the receiver signal RX. Such improper pulsing of the receiver signal RX may also result in converter failure.

Figure 4:
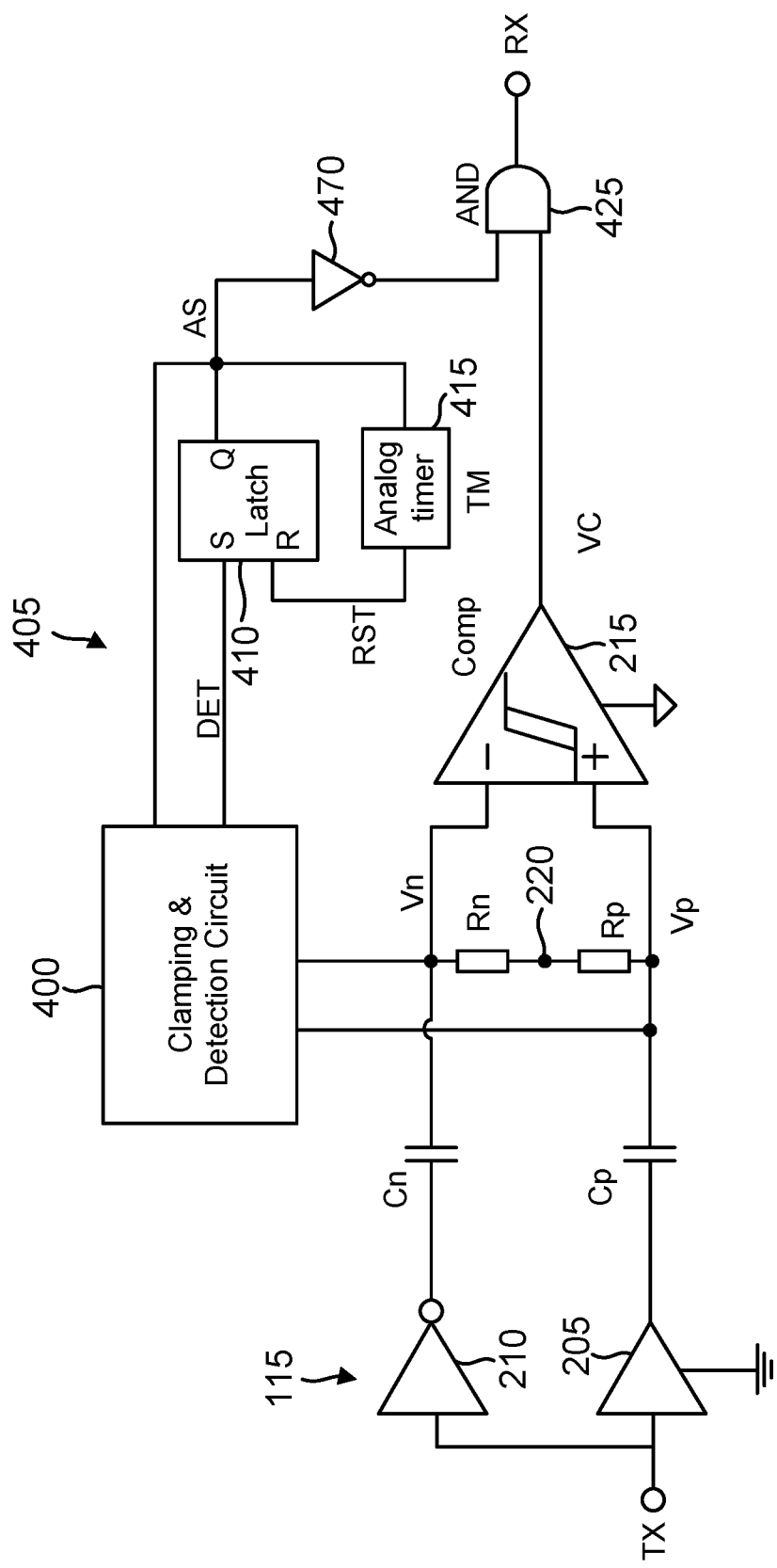
FIG. 4 illustrates a transmitter and receiver for an edge-triggering signal in which the receiver includes a detection circuit for forcing the receiver signal low in response to a rate of change for a common-mode noise exceeding a threshold value in accordance with an aspect of the disclosure.

To eliminate the risk of missing falling edges for the receiver signal RX, the common-mode noise may be monitored by a clamping and detection circuit 400 as shown in FIG. 4 for a receiver 405. Transmitter 115, capacitors Cn and Cp, resistors Rn and Rp, as well as comparator 215 are arranged as discussed with regard to FIG. 2. Clamping and detection circuit 400 couples to the nodes for the positive and negative filtered signals Vp and Vn and functions to clamp these signals to protect comparator 215. In addition, clamping and detection circuit 400 functions to detect whether the common-mode noise for signals Vp and Vn has a sufficiently large rate of change (dV/dt), which can be either positive or negative. Should clamping and detection circuit 400 detect such a large rate of change in the common-mode noise, it asserts a detection signal (DET) that sets a set-reset (SR) latch 410. In response, SR latch 410 asserts an output signal AS that is inverted by an inverter 420 to drive an input of an AND gate 425. AND gate 425 also processes the output of comparator 215 to form the receiver signal RX. During normal operation (no large rate of change in the common-mode noise), SR latch 410 is reset such that the output signal AS is grounded, which causes the output of inverter 420 to go high to the power supply voltage. The state of receiver signal RX will thus depend upon an output signal VC from comparator 215 during normal operation. Should the output signal VC be driven high, the receiver signal RX will follow. Similarly, if the output signal VC is low, so will be the receiver signal RX during normal operation.

When the common-mode noise rate of change is sufficient for clamping and detection circuit 400 to asset the detection signal DET, AND gate 425 drives the receiver signal RX low and will no longer respond to the output signal VC. To enable future pulses of the receiver signal RX, a timer such as an analog timer circuit 415 times a reset period in response to the assertion of the AS signal. At the termination of the reset period, analog timer circuit 415 asserts a reset signal to reset SR latch 410 so that the output of inverter 420 goes high. AND gate 425 can then respond normally to the output signal VC to pulse the receiver signal RX accordingly.

Figure 5:
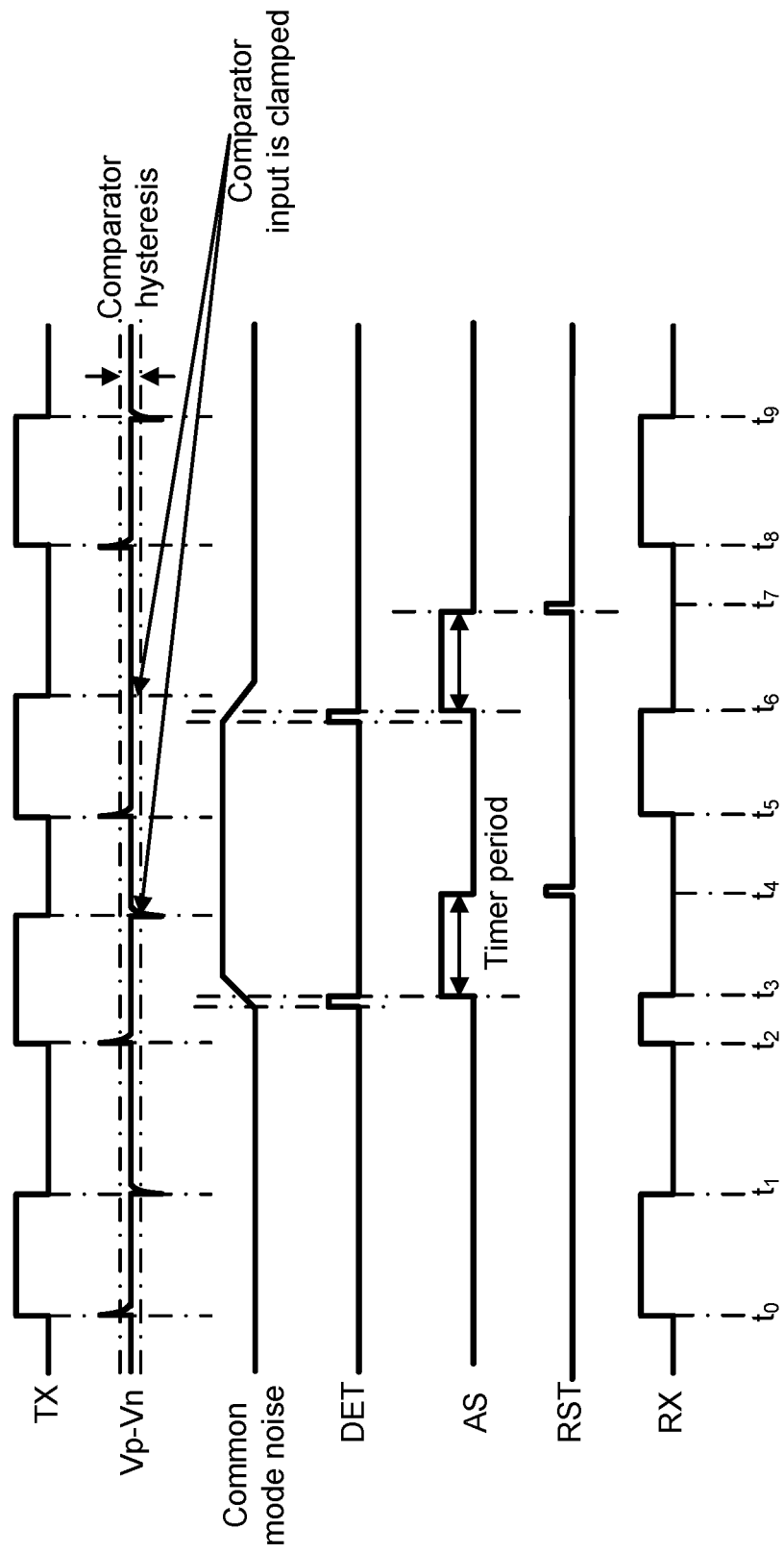
FIG. 5 illustrates some waveforms for the transmitter and receiver of FIG. 4.

Some waveforms for receiver 405 and transmitter 115 are shown in FIG. 5. The transmitter signal TX is pulsed four times so as to have a rising edge at a time t0, a time t2, a time t5, and a time t8. The first pulse for transmitter signal TX ends at a time t1. Since there was no large common-mode noise rate of change at time t0, the receiver signal RX pulses normally and also ends at time t1. The second pulse for the transmitter signal TX begins at time t2. During this pulse, a large rate of change occurs for the common-mode noise at a time t3. The detection signal DET is thus pulsed, which causes the AS signal to pulse high. The receiver signal RX is thus reset at time t3 back to ground. At a time t4, the analog timer times out so that the reset signal RST is pulsed to cause the AS signal to drop low. The receiver signal RX may thus have a rising edge at time t5 in response to the rising edge for the transmitter signal TX. At a time t6 during this pulse of the transmitter signal TX, the common-mode noise again has a large rate of change to cause the detection signal DET to pulse and begin a timer period for the AS signal. The receiver signal RX thus drops low at time t6. The AS signal times out at time t7. During the pulse of the transmitter signal from time 8 to a time t9, the receiver signal RX is pulsed normally. The signals Vp and Vn are clamped at times t4 and t6.

There may be embodiments in which an SR controller controls the synchronous rectification but may be switched off by a primary-side controller. For example, the synchronous rectification may be switched off should the flyback converter enter into a continuous conduction mode of operation. In such an embodiment, a pulsing high of the receiver signal RX commands the SR controller to switch off the synchronous rectification while the receiver signal RX remains high. The SR control may then resume when the receiver signal RX drops low. Should the rate of change for the common-mode noise be higher than a threshold level, the safest response would be to assert the receiver signal RX so that the synchronous rectification is switched off.

Figure 6:
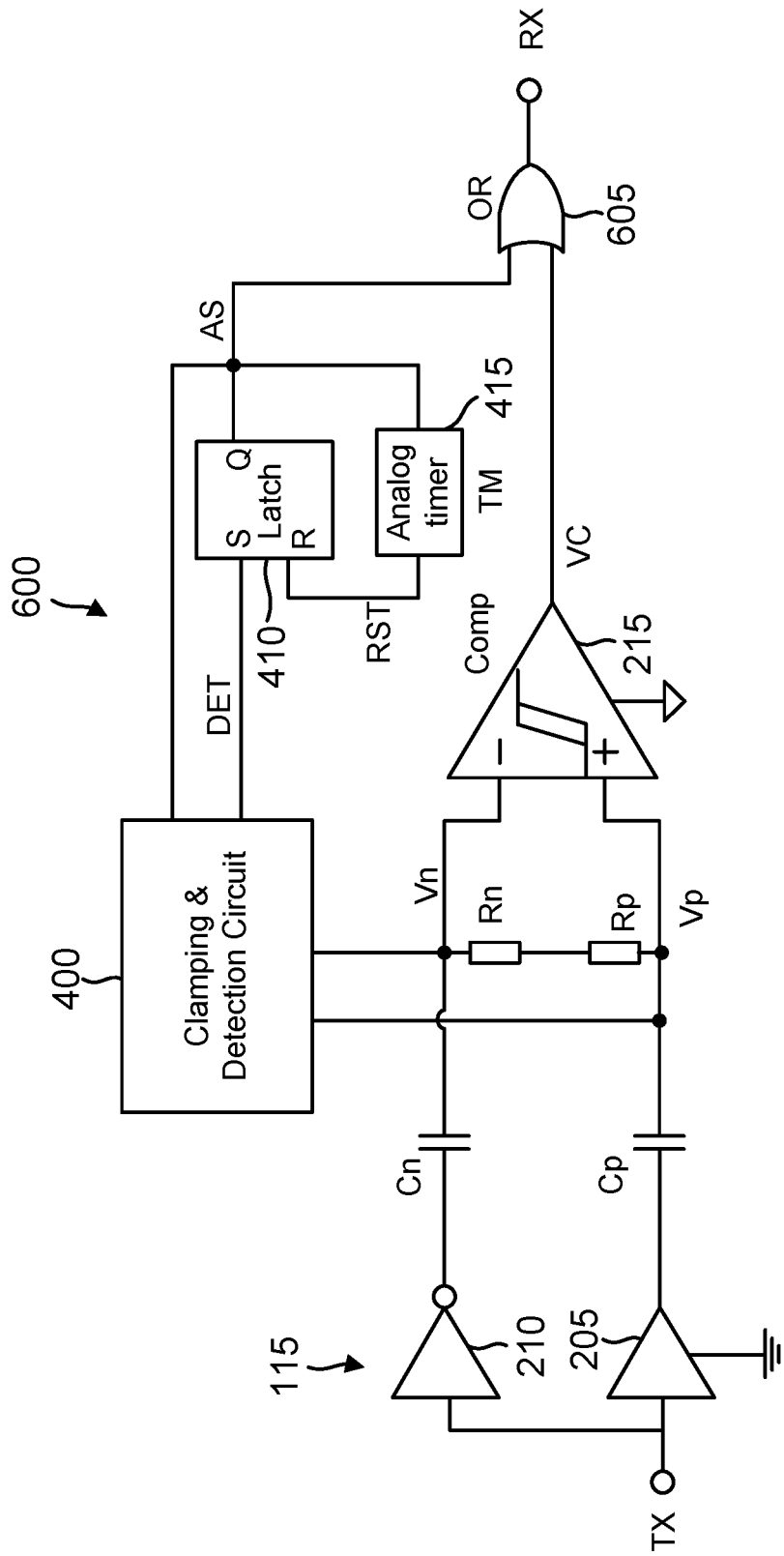
FIG. 6 illustrates a transmitter and receiver for an edge-triggering signal in which the receiver includes a detection circuit for forcing the receiver signal high in response to a rate of change for a common-mode noise exceeding a threshold value in accordance with an aspect of the disclosure.

An example transmitter 115 and receiver 600 are shown in FIG. 6 for an embodiment in which a sufficiently-high rate of change for the common-mode noise triggers an assertion of the receiver RX signal. Transmitter 115, capacitors Cp and Cn, resistors Rn and Rp, comparator 215, clamping and detection circuit 400, SR latch 410, and analog timer circuit 415 are all arranged as discussed with regard to FIG. 4. However, the AS signal from SR latch 410 is not inverted but instead drives an input to an OR gate 605 that also processes the VC output signal from comparator 215. Should the rate of change for the common-mode noise be below the threshold applied in clamping and detection circuit 400, SR latch 410 is in a reset state such that the AS signal is low during normal operation. The state of the VC output signal as controlled by the transmitter signal TX will then control the state of the receiver signal RX such that the pulsing of the receiver signal RX matches the pulsing of the transmitter signal TX. If the rate of change is greater than the threshold level, clamping and detection circuit 400 asserts the detection signal DET to set SR latch 410 and assert the AS signal. The receiver signal RX will then be asserted even if the transmitter signal TX is still low to assure that the synchronous rectification is turned off. After analog timer circuit 415 times out, it asserts the reset signal RST to again pull the AS signal low so that normal operation may resume.

Figure 7:
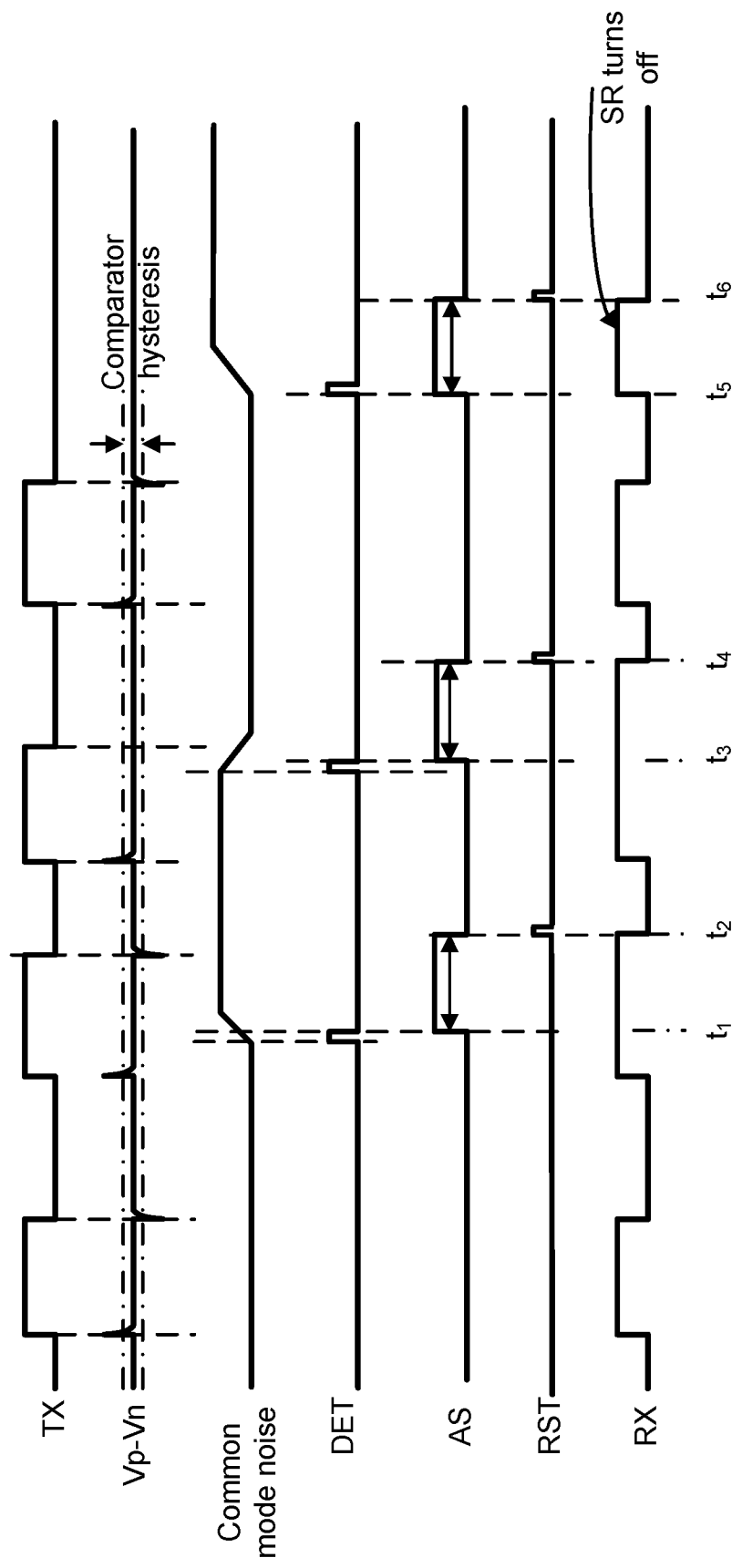
FIG. 7 illustrate some waveforms for the transmitter and receiver of FIG. 6.

Same waveforms for receiver 600 and transmitter 115 are shown in FIG. 7. At a time t1, the transmitter signal TX had pulsed during normal operation such that the receiver signal RX is already high but the rate of change for the common-mode noise exceeds its threshold value. The detection signal DET thus pulses high at time t1 but there is no rising edge for the receiver signal RX since it was already asserted. The AS signal is asserted and the timeout period initiated. The timeout period expires at a time t2, so that the reset signal RST is pulsed to force the AS signal low and de-assert the receiver signal RX. The rate of change again exceeds the threshold at a time t3. Since the receiver signal RX was already high at time t3, it remains high until the timeout period expires at a time t4. At a time t5, the rate of change also exceeds its threshold value. The receiver signal RX was low so it has a rising edge at time t5 and is not de-asserted until the timeout period expires at a time t6.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A receiver for a flyback converter, comprising:
a power switch transistor coupled to a primary winding of a transformer for the flyback converter;
a buffer configured to buffer an input signal to form a first voltage signal;
an inverter configured to invert the input signal to form a complement of the first voltage signal;
a first capacitor connected to a first resistor to form a first high-pass filter configured to high-pass filter the first voltage signal to form a first filtered signal;
a second capacitor connected to a second resistor to form a second high-pass filter configured to high-pass filter the complement of the first voltage signal to form a second filtered signal;
a comparator configured to assert a receiver signal responsive to a difference between the first filtered signal and the second filtered signal exceeding a positive threshold voltage and configured to ground the receiver signal responsive to the difference being less than a negative threshold voltage, wherein the receiver is further configured to control a switching of the power switch transistor responsive to the receiver signal;
a detection circuit configured to assert a detection signal responsive to a rate of change for a common-mode noise of the first filtered signal and of the second filtered signal exceeding a threshold rate of change; and
a logic gate configured to assert the receiver signal responsive to an output signal from the comparator while the detection signal is not asserted and to de-assert the receiver signal responsive to the assertion of the detection signal.

2. The receiver of claim 1, wherein the receiver is configured to switch on the power switch transistor responsive to the assertion of the receiver signal and to switch off the power switch transistor responsive to the receiver signal being grounded.

3. The receiver of claim 1, further comprising:
a first voltage clamping circuit configured to clamp the first filtered signal; and
a second voltage clamping circuit configured to clamp the second filtered signal.

4. The receiver of claim 1, further comprising:
a set-reset latch configured to set a latch output signal responsive to the assertion of the detection signal; and
an inverter configured to invert the latch output signal to form an inverter output signal, wherein the logic gate comprises an AND gate configured to AND the inverter output signal and the output signal from the comparator to form the receiver signal.

5. The receiver of claim 4, further comprising:
a timer circuit configured to time a timeout period responsive to latch output signal being set, wherein the timer circuit is further configured to reset the set-reset latch responsive to a termination of the timeout period.

* * * * *